(12) United States Patent
Endo et al.

(10) Patent No.: US 6,913,873 B2
(45) Date of Patent: Jul. 5, 2005

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 236 days.

(21) Appl. No.: 10/279,063

(22) Filed: Oct. 24, 2002

(65) Prior Publication Data

US 2003/0087194 A1 May 8, 2003

(30) Foreign Application Priority Data

Oct. 31, 2001 (JP) ........................................ 2001-334253

(51) Int. Cl.$^7$ ................................................. G03F 7/00
(52) U.S. Cl. ...................... 430/322; 430/270.1; 430/296
(58) Field of Search .............................. 430/270.1, 296, 430/311, 322

(56) References Cited

U.S. PATENT DOCUMENTS 5,558,976 A * 9/1996 Urano et al. ................ 430/326
6,033,826 A * 3/2000 Urano et al. .............. 430/270.1
6,358,665 B1 * 3/2002 Pawlowski et al. ....... 430/270.1

FOREIGN PATENT DOCUMENTS

JP 2002-169291 A 6/2002

OTHER PUBLICATIONS

"High Performance EB Chemically Amplified Resist Using Alicyclic Protetive Groups"; Jun–Ichi Kon et al.; SPIE, v3999(2000);p. 1207–1214.*

* cited by examiner

*Primary Examiner*—Kathleen Duda
(74) *Attorney, Agent, or Firm*—McDermott Will & Emery LLP

(57) ABSTRACT

A resist film is formed from a chemically amplified resist material including a phenol polymer, an acrylic polymer and an onium salt serving as an acid generator. The resist film is selectively irradiated for pattern exposure with extreme UV of a wavelength of a 1 nm through 30 nm band or an electron beam, and is developed after the pattern exposure, so as to form a resist pattern.

6 Claims, 4 Drawing Sheets

PATTERN FORMATION METHOD

BACKGROUND OF THE INVENTION

The present invention relates to a pattern formation method for forming a resist pattern by selectively irradiating a resist film made from a chemically amplified resist material with extreme UV or an electron beam.

In processes for semiconductor integrated circuit devices, lithography technique is desired to be further developed in accordance with increase of the degree of integration and downsizing of semiconductor integrated circuits.

As exposing light employed in the lithography technique, a mercury lamp, KrF excimer laser (of a wavelength of a 248 nm band), ArF excimer laser (of a wavelength of a 193 nm band) or the like is currently used. For the generation of 0.1 $\mu$m or less, and particularly of 0.05 $\mu$m or less, whole exposure to extreme UV of a wavelength (of a 1 nm through 30 nm band) shorter than that of the ArF excimer laser or an electron beam (EB) is now being examined to be employed.

In the lithography technique using extreme UV or an electron beam as the exposing light, a chemically amplified resist material with high resolution and high sensitivity is preferably used.

Therefore, in the lithography technique using extreme UV or an electron beam, a chemically amplified resist material suitable for the ArF excimer laser lasing at a wavelength close to that of extreme UV is now being examined for use.

Now, a first conventional pattern formation method will be described with reference to FIGS. 3A through 3D.

First, a chemically amplified resist material having the following composition is prepared:

| | |
|---|---|
| Base polymer: poly((t-butyloxystyrene) – (hydroxystyrene)) (wherein t-butyloxystyrene:hydroxystyrene = 40 mol %:60 mol %) | 1.8 g |
| Acid generator: triphenylsulfonium triflate | 0.4 g |
| Solvent: propylene glycol monomethyl ether acetate | 20 g |

Next, as shown in FIG. 3A, the chemically amplified resist material having the aforementioned composition is applied on a semiconductor substrate 1 so as to form a resist film 2 with a thickness of 0.2 $\mu$m.

Then, as shown in FIG. 3B, the resist film 2 is selectively irradiated for pattern exposure with extreme UV 3 (of a wavelength of a 13.5 nm band) with exposure energy of 30 MJ/cm$^2$ through a reflection mask (not shown) having a desired mask pattern. After the pattern exposure, as shown in FIG. 3C, the resist film 2 is subjected to post-exposure bake (PEB) with a hot plate at a temperature of 100° C. for 60 seconds.

In this manner, an exposed portion 2a of the resist film 2 becomes soluble in an alkaline developer owing to a function of an acid generated from the acid generator while an unexposed portion 2b of the resist film 2 remains insoluble in an alkaline developer because no acid is generated from the acid generator therein.

Next, the resist film 2 is developed with an alkaline developer, such as a 2.38 wt % tetramethylammonium hydroxide developer, so as to form a resist pattern 4 with a line width of 0.07 $\mu$m from the unexposed portion 2b of the resist film 2 as shown in FIG. 3D.

Next, a second conventional pattern formation method will be described with reference to FIGS. 4A through 4D.

First, a chemically amplified resist material having the following composition is prepared:

| | |
|---|---|
| Base polymer: poly((t-butyloxycarbonyloxystyrene) – (hydroxystyrene)) (wherein t-butyloxycarbonyloxystyrene:hydroxystyrene = 35 mol %:65 mol %) | 1.8 g |
| Acid generator: triphenylsulfonium triflate | 0.8 g |
| Solvent: propylene glycol monomethyl ether acetate | 20 g |

Next, as shown in FIG. 4A, the chemically amplified resist material having the aforementioned composition is applied on a semiconductor substrate 1 so as to form a resist film 2 with a thickness of 0.2 $\mu$m.

Then, as shown in FIG. 4B, the resist film 2 is selectively irradiated for pattern exposure with an electron beam (of 100 kV) with exposure energy of 25 $\mu$C/cm$^2$ through a mask 6 having a desired mask pattern. After the pattern exposure, as shown in FIG. 4C, the resist film 2 is subjected to post-exposure bake (PEB) with a hot plate at a temperature of 110° C. for 60 seconds.

In this manner, an exposed portion 2a of the resist film 2 becomes soluble in an alkaline developer owing to a function of an acid generated from the acid generator while an unexposed portion 2b of the resist film 2 remains insoruble in an alkaline developer because no acid is generated from the acid generator therein.

Next, the resist film 2 is developed with an alkaline developer, such as a 2.38 wt % tetramethylammonium hydroxide developer, so as to form a resist pattern 4 with a line width of 0.06 $\mu$m from the unexposed portion 2b of the resist film 2 as shown in FIG. 4D.

The exposure energy of the extreme UV is 30 mJ/cm$^2$ in the first conventional method and the exposure energy of the electron beam is 25 $\mu$C/cm$^2$ in the second conventional method. Thus, large exposure energy is required in any of the conventional methods. This is because a conventional chemically amplified resist material is not sufficiently sensitive to extreme UV or an electron beam.

Since large exposure energy is thus necessary in the conventional pattern formation method using extreme UV or an electron beam as the exposing light, the throughput in the lithography in the semiconductor fabrication process is disadvantageously poor.

Although the exposure energy of extreme UV or an electron beam can be lowered by increasing the amount of the acid generator included in the chemically amplified resist material, when the amount of acid generator is increased, particles are unavoidably produced in the chemically amplified resist material. Therefore, the amount increase of the acid generator is not preferred.

SUMMARY OF THE INVENTION

In consideration of the above-described conventional problem, an object of the invention is lowering exposure energy of extreme UV or an electron beam used for irradiating a resist film made from a chemically amplified resist material.

In order to achieve the object, the first pattern formation method of this invention includes the steps of forming a resist film from a chemically amplified resist material including a phenol polymer, an acrylic polymer and an onium salt serving as an acid generator; selectively irradiating the resist film for pattern exposure with extreme UV of a wavelength of a 1 nm through 30 nm band or an electron beam; and forming a resist pattern by developing the resist film after the pattern exposure.

In the first pattern formation method, when the phenol polymer is irradiated with extreme UV or an electron beam, phenol radicals are generated from the phenol polymer.

Since the generated phenol radicals excite the onium salt, an acid is generated from the onium salt. According to an experiment made by the present inventors, it has been found that when an acrylic polymer is included in a chemically amplified resist material including a phenol polymer, the amount of phenol radicals generated from the phenol polymer is increased.

Accordingly, the large amount of phenol radicals excite the onium salt, and hence, the amount of acid generated from the onium salt is also increased, so as to improve the sensitivity of the resist film. As a result, exposure energy of the extreme UV or the electron beam used for irradiating the resist film made from the chemically amplified resist material can be lowered.

In the first pattern formation method, the acrylic polymer is preferably poly(acrylic acid) or poly(methyl acrylate).

Thus, the amount of phenol radicals generated from the phenol polymer can be definitely increased.

The second pattern formation method of this invention includes the steps of forming a resist film from a chemically amplified resist material including a phenol polymer, an acrylic compound and an onium salt serving as an acid generator; selectively irradiating the resist film for pattern exposure with extreme UV of a wavelength of a 1 nm through 30 nm band or an electron beam; and forming a resist pattern by developing the resist film after the pattern exposure.

In the second pattern formation method, in the same manner as in the first pattern formation method, when the phenol polymer is irradiated with extreme UV or an electron beam, phenol radicals are generated from the phenol polymer, so that the generated phenol radicals can excite the onium salt. According to an experiment made by the present inventors, it has been found that when an acrylic compound is included in a chemically amplified resist material including a phenol polymer, the amount of phenol radicals generated from the phenol polymer is increased.

Accordingly, the large amount of phenol radicals excite the onium salt, and hence, the amount of acid generated from the onium salt is also increased, so as to improve the sensitivity of the resist film. As a result, the exposure energy of the extreme UV or the electron beam used for irradiating the resist film made from the chemically amplified resist material can be lowered.

In the second pattern formation method, the acrylic compound is preferably acrylic acid or methyl acrylate.

Thus, the amount of phenol radicals generated from the phenol polymer can be definitely increased.

DETAILED DESCRIPTION OF THE INVENTION

Embodiment 1

A pattern formation method according to Embodiment 1 of the invention will now be described with reference to FIGS. 1A through 1D.

First, a chemically amplified resist material having the following composition is prepared:

| | |
|---|---|
| Phenol polymer: poly((t-butyloxystyrene) – (hydroxystyrene)) (wherein t-butyloxystyrene:hydroxystyrene = 40 mol %:60 mol %) | 1.8 g |
| Acrylic polymer: poly(acrylic acid) | 0.2 g |
| Onium salt: triphenylsulfonium triflate | 0.4 g |
| Solvent: propylene glycol monomethyl ether acetate | 20 g |

Figure 1A:
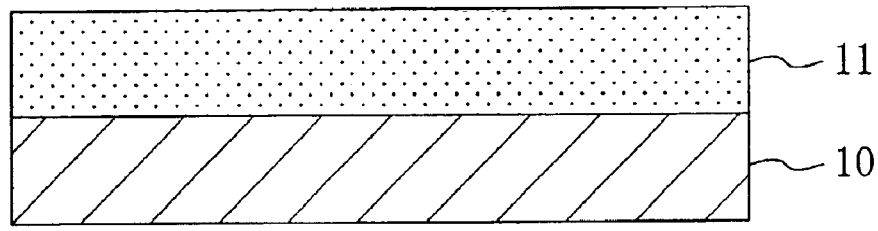
FIGS. 1A, 1B, 1C and 1D are cross-sectional views for showing procedures in a pattern formation method according to Embodiment 1 of the invention.
Figure 1B:
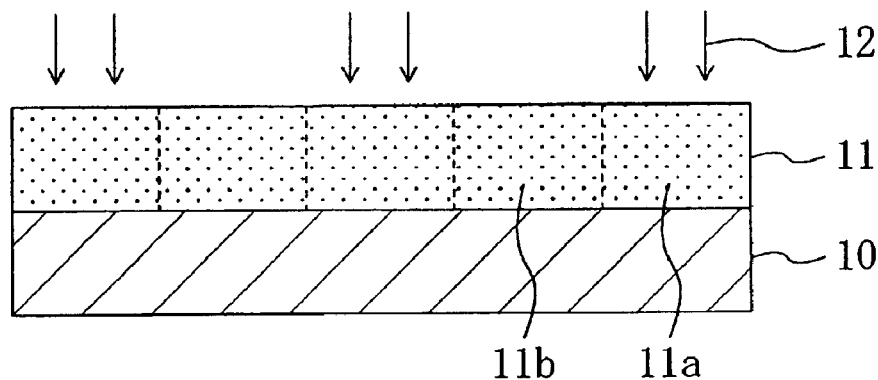

Next, as shown in FIG. 1A, the chemically amplified resist material having the aforementioned composition is applied on a semiconductor substrate 10, so as to form a resist film 11. Then, as shown in FIG. 1B, the resist film 11 is selectively irradiated for pattern exposure with extreme UV 12 (of a wavelength of a 13.5 nm band) with exposure energy of 8 mJ/cm$^2$ through a reflection mask (not shown).

Figure 1C:
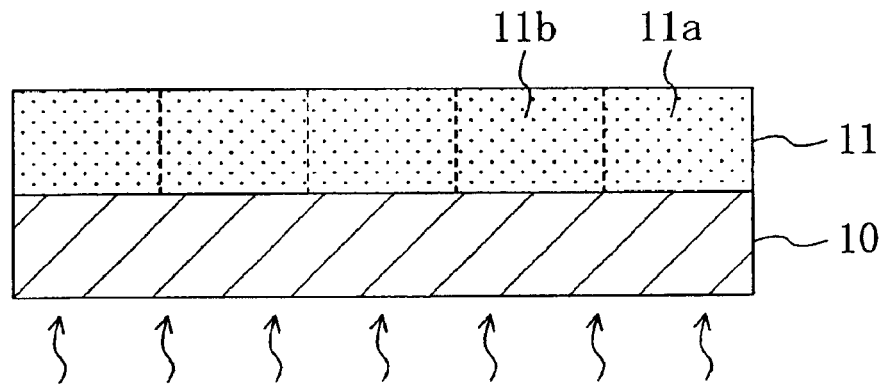

After the pattern exposure, the resist film 11 is subjected to post-exposure bake (PEB) by annealing the substrate 10 at a temperature of 100° C. for 60 seconds with a hot plate (not shown) as shown in FIG. 1C. In this manner, an exposed portion 11a of the resist film 11 becomes soluble in an alkaline developer owing to a function of an acid generated from the onium salt (i.e., an acid generator) while an unexposed portion 11b of the resist film 11 remains insoluble in an alkaline developer because no acid is generated from the onium salt therein.

Figure 1D:
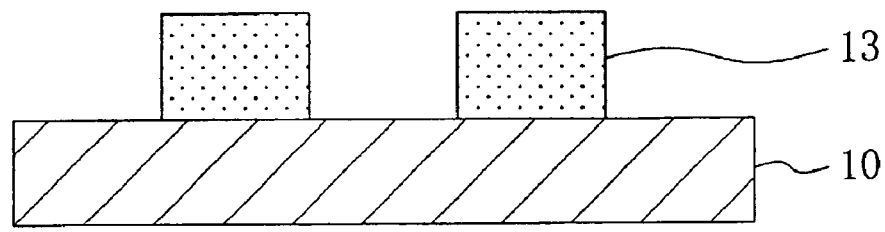

Next, the resist film 11 is developed with a 2.38 wt % tetramethylammonium hydroxide developer (i.e., an alkaline developer), so as to form a resist pattern 13 with a line width of 0.07 μm from the unexposed portion 11b of the resist film 11 as shown in FIG. 1D.

Since the chemically amplified resist material including the phenol polymer also includes the acrylic polymer in Embodiment 1, the amount of phenol radicals generated from the phenol polymer is increased. In accordance with the increase of the amount of phenol radicals, the amount of acid generated from the onium salt is also increased, so that the sensitivity of the resist film can be improved. As a result, the exposure energy of the extreme UV used for irradiating the resist film 11 can be lowered from 30 mJ/cm$^2$ to 8 mJ/cm$^2$.

Embodiment 2

A pattern formation method according to Embodiment 2 of the invention will now be described with reference to FIGS. 2A through 2D.

First, a chemically amplified resist material having the following composition is prepared:

| | |
|---|---|
| Phenol polymer: poly((t-butyloxycarbonyloxystyrene) – (hydroxystyrene)) (wherein t-butyloxycarbonyloxystyrene:hydroxystyrene = 35 mol %:65 mol %) | 1.8 g |
| Acrylic compound: acrylic acid | 0.3 g |
| Onium salt: triphenylsulfonium triflate | 0.8 g |
| Solvent: propylene glycol monomethyl ether acetate | 20 g |

Figure 2A:
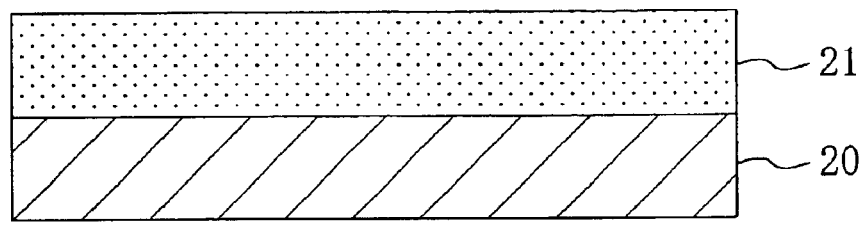
FIGS. 2A, 2B, 2C and 2D are cross-sectional views for showing procedures in a pattern formation method according to Embodiment 2 of the invention.
Figure 2B:
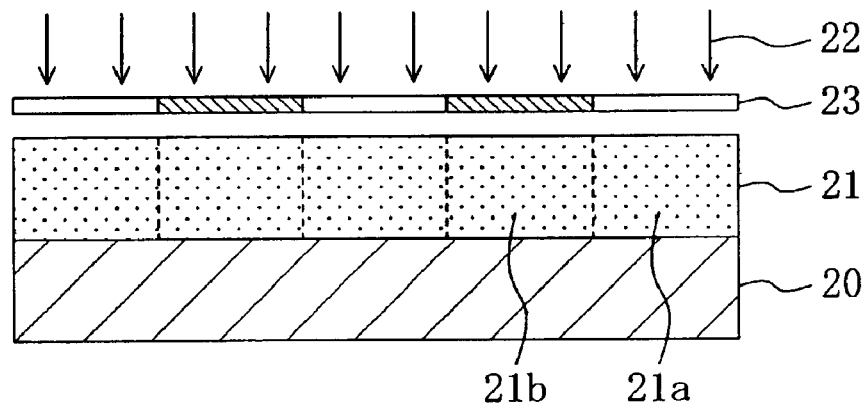

Next, as shown in FIG. 2A, the chemically amplified resist material having the aforementioned composition is applied on a semiconductor substrate 20, so as to form a resist film 21. Then, the resist film 21 is selectively irradiated for pattern exposure with an electron beam 22 with exposure energy of 5 μC/cm$^2$ through a mask 23.

Figure 2C:
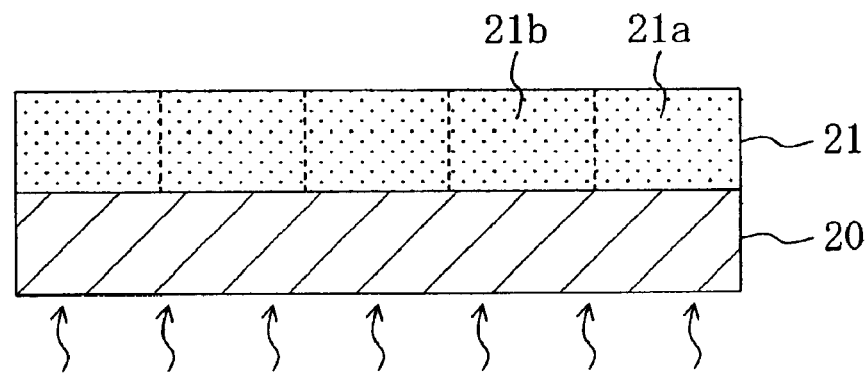

After the pattern exposure, the resist film 21 is subjected to post-exposure bake (PEB) by annealing the substrate 20 with a hot plate (not shown) at a temperature of 110° C. for 60 seconds as shown in FIG. 2C. In this manner, an exposed portion 21a of the resist film 21 becomes soluble in an alkaline developer owing to a function of an acid generated from the onium salt (i.e., an acid generator) while an unexposed portion 21b of the resist film 21 remains insoluble in an alkaline developer because no acid is generated from the onium salt therein.

Figure 2D:
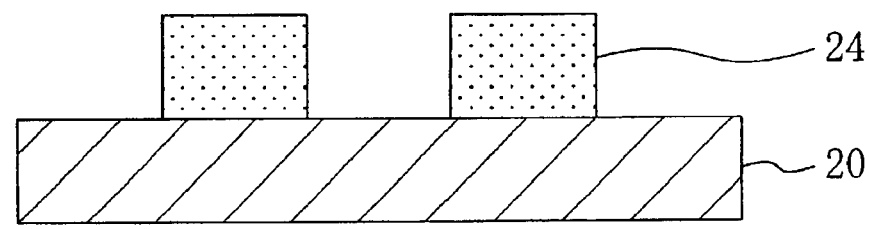
Figure 3A:
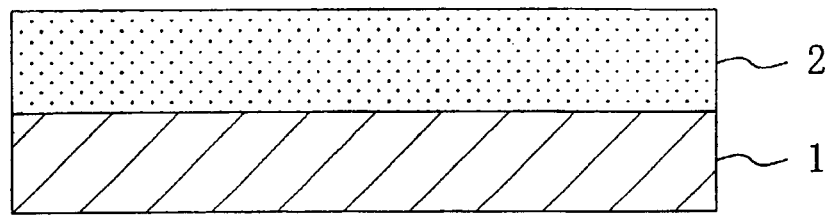
FIGS. 3A, 3B, 3C and 3D are cross-sectional views for showing procedures in a first conventional pattern formation method.
Figure 3B:
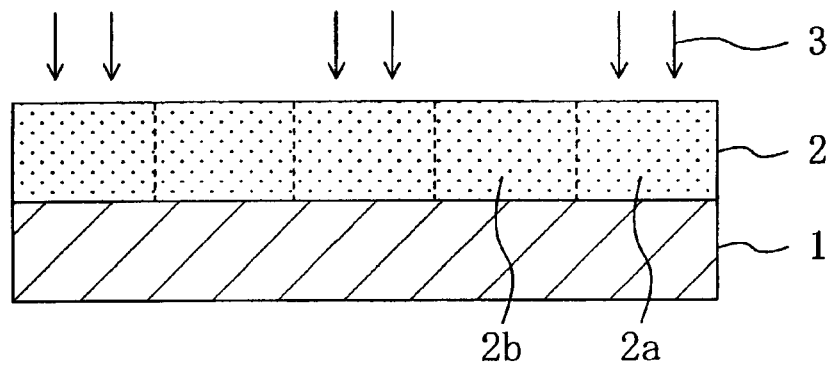
Figure 3C:
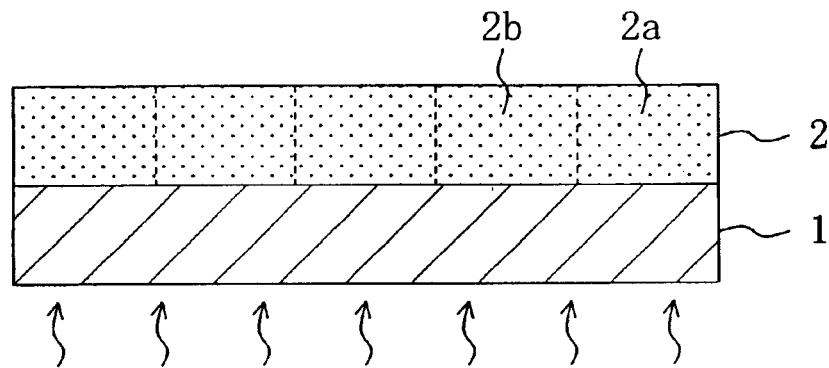
Figure 3D:
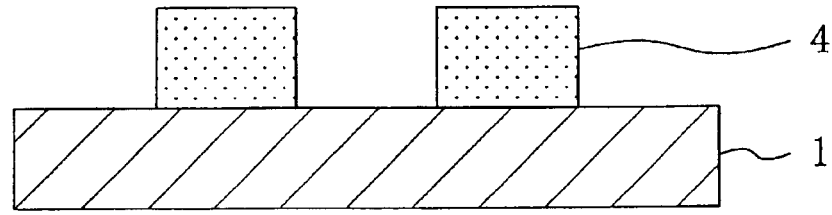
Figure 4A:
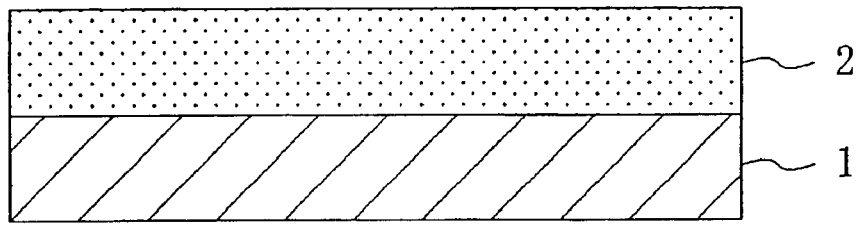
FIGS. 4A, 4B, 4C and 4D are cross-sectional views for showing procedures in a second conventional pattern formation method.
Figure 4B:
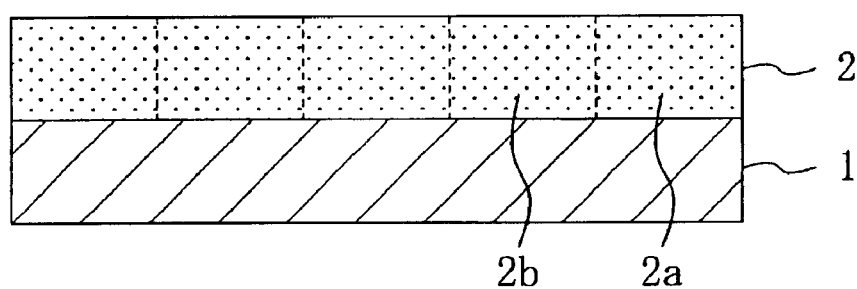
Figure 4C:
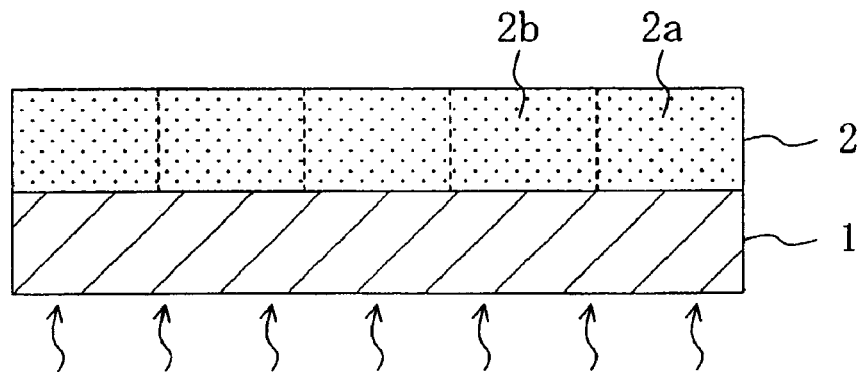
Figure 4D:
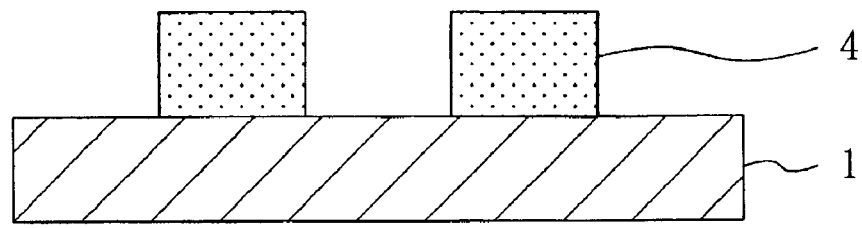

Next, the resist film 21 is developed with a 2.38 wt % tetramethylammonium hydroxide developer (i.e., an alkaline developer), so as to form a resist pattern 24 with a line width of 0.06 μm from the unexposed portion 21b of the resist film 21 as shown in FIG. 2D.

Since the chemically amplified resist material including the phenol polymer also includes the acrylic compound in Embodiment 2, the amount of phenol radicals generated from the phenol polymer is increased. In accordance with the increase of the amount of phenol radicals, the amount of acid generated from the onium salt is also increased, so that the sensitivity of the resist film can be improved. As a result, the exposure energy of the electron beam used for irradiating the resist film 21 can be lowered from 25 $\mu C/cm^2$ to 5 $\mu C/cm^2$.

Although a positive chemically amplified resist material is used in Embodiments 1 and 2, a negative chemically amplified resist material obtained by adding a crosslinking agent to a chemically amplified resist material can be used instead. Examples of the crosslinking agent are as follows:

2,4,6-tris(methoxymethyl)amino-1,3,5-s-triazine
2,4,6-tris(ethoxymethyl)amino-1,3,5-s-triazine (1) Examples of the phenol polymer used in Embodiment 1 or 2 are as follows:

poly((ethoxyethyloxystyrene)-(hydroxystyrene)) (wherein ethoxyethyloxystyrene: hydroxystyrene=35 mol %:65 mol %)

poly((methoxymethyloxystyrene)-(hydroxystyrene)) (wherein methoxymethyloxystyrene:hydroxystyrene=40 mol %:60 mol %)

poly((tetrahydropyranyloxystyrene)-(hydroxystyrene)) (wherein tetrahydropyranyloxystyrene:hydroxystyrene=35 mol %:65 mol %)

poly((phenoxyethyloxystyrene)-(hydroxystyrene)) (wherein phenoxyethyloxystyrene:hydroxystyrene=32 mol %:68 mol %)

poly((t-butyloxystyrene)-(hydroxystyrene)) (wherein t-butyloxystyrene hydroxystyrene=30 mol %:70 mol %)

poly((t-butyloxycarbonyloxystyrene)-(hydroxystyrene)) (wherein t-butyloxycarbonyloxystyrene: hydroxystyrene=30 mol %:70 mol %)

poly((t-butyloxycarbonylmethyloxystyrene)-(hydroxystyrene)) (wherein t-butyloxycarbonylmethyloxystyrene:hydroxystyrene=28 mol %:72 mol %)

poly(vinyl phenol)

(2) Examples of the acrylic polymer used in Embodiment 1 are as follows:

poly(acrylic acid)
poly(methyl acrylate)
poly(ethyl acrylate)
poly(phenyl acrylate)
poly(vinyl acrylate)
poly(2-methyl-2-adamantyl acrylate)
poly(2-ethyl-2-adamantyl acrylate)
poly(mevalonic lactone acrylate)
poly(γ-butyrolactone acrylate)
poly((2-methyl-2-adamantyl acrylate)-(mevalonic lactone acrylate)) (wherein 2-methyl-2-adamantyl acrylate: mevalonic lactone acrylate=50 mol %:50 mol %)

poly((2-etyhyl-2-adamantyl acrylate)-(γ-butyrolactone acrylate)) (wherein 2-ethyl-2-adamantyl acrylate: γ-butyrolactone acrylate=50 mol %:50 mol %)

poly((2-methyl-2-adamantyl acrylate)-(methyl acrylate)-(acrylic acid)) (wherein 2-methyl-2-adamantyl acrylate:methyl acrylate:acrylic acid=70 mol %:20 mol %:10 mol %)

poly((2-ethyl-2-adamantyl acrylate)-(methyl acrylate)-(acrylic acid)) (wherein 2-ethyl-2-adamantyl acrylate:methyl acrylate:acrylic acid=70 mol %:20 mol %:10 mol %)

(3) Examples of the acrylic compound used in Embodiment 2 are as follows:

acrylic acid
methyl acrylate
ethyl acrylate
phenyl acrylate
vinyl acrylate
2-methyl-2-adamantyl acrylate
2-ethyl-2-adamantyl acrylate
mevalonic lactone acrylate
γ-butyrolactone acrylate (4) Examples of the onium salt used in Embodiment 1 or 2 are as follows:

triphenylsulfonium trifluoromethanesulfonate
triphenylsulfonium nonafluorobutanesulfonate
diphenyliodonium trifluoromethanesulfonate
diphenyliodonium nonafluorobutanesulfonate
di(4-t-butylphenyl)iodonium trifluoromethanesulfonate
di(4-t-butylphenyl)iodonium nonafluorobutanesulfonate

What is claimed is:

1. A pattern formation method comprising the steps of:
    forming a resist film from a chemically amplified resist material including separately a phenol polymer, an acrylic polymer and an onium salt serving as an acid generator;
    selectively irradiating said resist film for pattern exposure with extreme UV of a wavelength of a 1 nm through 30 nm band or an electron beam; and
    forming a resist pattern by developing said resist film after the pattern exposure.

2. The pattern formation method of claim 1, wherein said acrylic polymer is poly(acrylic acid) or poly(methyl acrylate).

3. The pattern formation method of claim 1, wherein an amount of said phenol polymer is larger than an amount of said acrylic polymer.

4. A pattern formation method comprising the steps of:
    forming a resist film from a chemically amplified resist material including a phenol polymer, an acrylic compound and an onium salt serving as an acid generator;
    selectively irradiating said resist film for pattern exposure with extreme UV of a wavelength of a 1 nm through 30 nm band or an electron beam; and
    forming a resist pattern by developing said resist film after the pattern exposure.

5. The pattern formation method of claim 4, wherein said acrylic compound is acrylic acid or methyl acrylate.

6. The pattern formation method of claim 4, wherein an amount of said phenol polymer is larger than an amount of said acrylic polymer.

* * * * *